(12) United States Patent
Inoue et al.

(10) Patent No.: US 12,463,149 B2
(45) Date of Patent: Nov. 4, 2025

(54) RADIATION DETECTOR MANUFACTURING METHOD, RADIATION DETECTOR, RADIATION IMAGING APPARATUS, AND RADIATION IMAGING SYSTEM

(71) Applicant: CANON KABUSHIKI KAISHA, Tokyo (JP)

(72) Inventors: Masato Inoue, Saitama (JP); Yoshito Sasaki, Tokyo (JP); Tomohiro Hoshina, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 305 days.

(21) Appl. No.: 18/313,453

(22) Filed: May 8, 2023

(65) Prior Publication Data

US 2023/0378097 A1    Nov. 23, 2023

(30) Foreign Application Priority Data

May 17, 2022    (JP) ................. 2022-081073

(51) Int. Cl.
*H01L 23/00*    (2006.01)
*A61B 6/42*    (2024.01)
(Continued)

(52) U.S. Cl.
CPC .......... *H01L 23/562* (2013.01); *A61B 6/4208* (2013.01); *G01T 1/20182* (2020.05); *H10F 39/107* (2025.01)

(58) Field of Classification Search
CPC ............... H01L 23/562; H01L 21/6835; H01L 2221/68345; A61B 6/4208;
(Continued)

(56) References Cited

U.S. PATENT DOCUMENTS 8,686,361 B2    4/2014  Nomura et al.
11,624,716 B2   4/2023  Ushikura et al.
(Continued)

FOREIGN PATENT DOCUMENTS

JP    2012112725 A  *  6/2012  ............. H10D 99/00
JP    6880309 B2  *  6/2021  ......... H10F 39/1895
(Continued)

OTHER PUBLICATIONS

U.S. Appl. No. 18/360,027, filed Jul. 27, 2023, Sasaki et al.

*Primary Examiner* — Edwin C Gunberg
*Assistant Examiner* — Richard O Toohey
(74) *Attorney, Agent, or Firm* — Venable LLP (57) ABSTRACT

A radiation detector manufacturing method is provided. The method includes: preparing a structure including a support base, a flexible base member arranged on the support base and having a principal surface including a pixel region in which a plurality of pixels are arranged, a scintillator arranged so as to cover the pixel region, and a protective layer arranged so as to cover the scintillator; and removing the support base from the flexible base member. The principal surface includes a peripheral region not covered with the protective layer. The method further includes, before the removing, arranging a reinforcing member in contact with the peripheral region, in a position overlapping the peripheral region and not overlapping the scintillator, in orthogonal projection to the principal surface.

12 Claims, 10 Drawing Sheets

(51) Int. Cl.
*G01T 1/20* (2006.01)
*H10F 39/10* (2025.01)

(58) Field of Classification Search
CPC ....... G01T 1/20182; G01T 1/202; G01T 1/20; H10F 39/107; H10F 39/1898
See application file for complete search history.

(56) References Cited

U.S. PATENT DOCUMENTS

| | | |
|---|---|---|
| 11,630,221 B2 | 4/2023 | Kato et al. |
| 2021/0096271 A1 | 4/2021 | Okada et al. |

FOREIGN PATENT DOCUMENTS

| | | | | |
|---|---|---|---|---|
| WO | WO 2018173893 A1 * | 9/2018 | ............. | G01T 1/246 |
| WO | 2019/181570 A1 | 9/2019 | | |

* cited by examiner

RADIATION DETECTOR MANUFACTURING METHOD, RADIATION DETECTOR, RADIATION IMAGING APPARATUS, AND RADIATION IMAGING SYSTEM

BACKGROUND OF THE INVENTION

Field of the Invention

The present invention relates to a radiation detector manufacturing method, a radiation detector, a radiation imaging apparatus, and a radiation imaging system.

Description of the Related Art

In medical image diagnosis and nondestructive inspection, a radiation imaging apparatus using a radiation detector including a scintillator and a plurality of pixels for detecting light converted from radiation by the scintillator is widely used. Japanese Patent No. 6880309 discloses a method of using a flexible base member as a substrate in order to decrease the weight of a radiation detector. When manufacturing a radiation detector, a flexible base member is formed on a support member such as a glass substrate, and pixels, a scintillator, and the like are formed on the base member. A lightweight radiation detector can be obtained by removing the support member after the pixels, the scintillator, and the like are formed.

SUMMARY OF THE INVENTION

When removing the support member from the base member, a peripheral region of the base member not covered with the scintillator and the like easily bends, and this may decrease the yield because, for example, a wiring pattern arranged in the peripheral region cracks.

Some embodiments of the present invention provide a technique advantageous in improving the quality of a radiation detector.

According to some embodiments, a radiation detector manufacturing method, comprising: preparing a structure including a support base, a flexible base member arranged on the support base and having a principal surface including a pixel region in which a plurality of pixels are arranged, a scintillator arranged so as to cover the pixel region, and a protective layer arranged so as to cover the scintillator; and removing the support base from the flexible base member, wherein the principal surface includes a peripheral region not covered with the protective layer, and the method further comprises, before the removing, arranging a reinforcing member in contact with the peripheral region, in a position overlapping the peripheral region and not overlapping the scintillator, in orthogonal projection to the principal surface, is provided.

According to some embodiments, a radiation detector manufacturing method, comprising: preparing a structure including a support base, a flexible base member arranged on the support base and having a principal surface including a pixel region in which a plurality of pixels are arranged, a scintillator arranged so as to cover the pixel region, a protective layer arranged so as to cover the scintillator, and a wiring board connected to an outer edge portion of the principal surface; and removing the support base from the flexible base member, wherein the principal surface includes a peripheral region not covered with the protective layer, the method further comprises, before the removing, arranging a reinforcing member in a position overlapping the peripheral region, the protective layer, and the wiring board, and not overlapping the scintillator, in orthogonal projection to the principal surface, and the reinforcing member is in contact with the protective layer and the wiring board, and is not in contact with the peripheral region, is provided.

According to some embodiments, a radiation detector manufacturing method, comprising: preparing a structure including a support base, a flexible base member arranged on the support base, a scintillator arranged so as to cover a pixel region including a plurality of pixels of the flexible base member, and a protective layer arranged so as to cover the scintillator; and removing the support base from the flexible base member, wherein a principal surface including the pixel region of the flexible base member includes a peripheral region not covered with the protective layer, the method further comprises, before the removing, placing the structure on a stage, in the placing, the principal surface is positioned so as to face a placement surface of the stage, on which the structure is placed, a convex portion is arranged on the placement surface so as to extend from the placement surface to the peripheral region, in a position overlapping the peripheral region and not overlapping the scintillator, in orthogonal projection to the principal surface, and the removing is performed in a state in which the structure is placed on the stage, is provided.

According to some embodiments, a radiation detector comprising a flexible base member having a principal surface including a pixel region in which a plurality of pixels are arranged, a scintillator arranged so as to cover the pixel region, and a protective layer arranged so as to cover the scintillator, wherein the principal surface includes a peripheral region not covered with the protective layer, a reinforcing member in contact with the peripheral region is further arranged in a position overlapping the peripheral region and not overlapping the scintillator, in orthogonal projection to the principal surface, the protective layer includes an upper surface in a position furthest from the principal surface, and the reinforcing member is arranged nearer to a principal surface side than a virtual surface including the upper surface and parallel to the principal surface, is provided.

According to some embodiments, a radiation detector comprising a flexible base member having a principal surface including a pixel region in which a plurality of pixels are arranged, a scintillator arranged so as to cover the pixel region, a protective layer arranged so as to cover the scintillator, and a wiring board connected to an outer edge portion of the principal surface, wherein the principal surface includes a peripheral region not covered with the protective layer, a reinforcing member in contact with the peripheral region is further arranged in a position overlapping the peripheral region, the protective layer, and the wiring board, and not overlapping the scintillator, in orthogonal projection to the principal surface, the reinforcing member is in contact with the protective layer and the wiring board, and is not in contact with the peripheral region, the protective layer includes an upper surface in a position furthest from the principal surface, and the reinforcing member is arranged nearer to a principal surface side than a virtual surface including the upper surface and parallel to the principal surface, is provided.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Radiation according to the present invention can include, for example, α-ray, β-ray, and γ-ray as beams formed by particles (including photons) released by radioactive decay, and beams having equal or higher energy, such as X-ray, particle beam, and cosmic ray.

Figure 1:
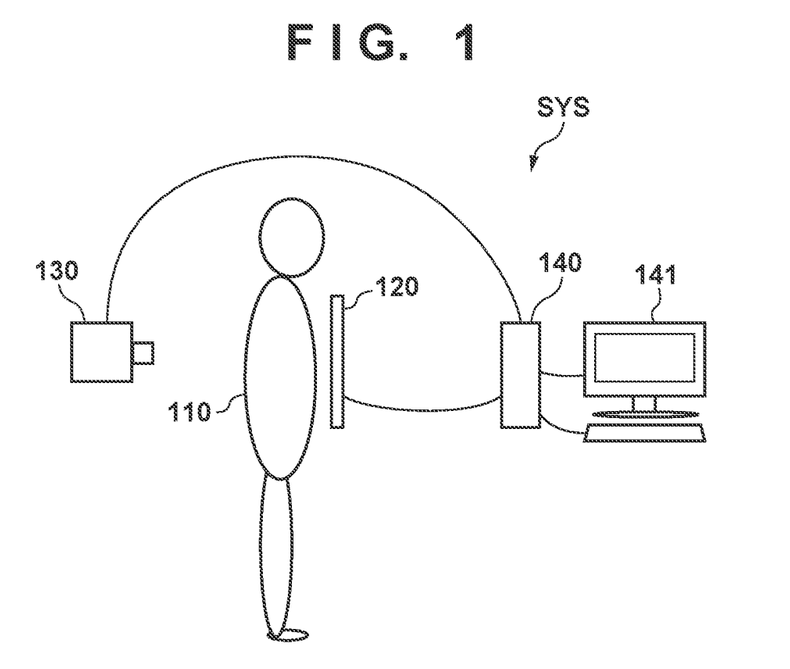
FIG. 1 is a view showing a configuration example of a radiation imaging system using a radiation detector according to the present invention.

A radiation detector manufacturing method according to this embodiment will be explained below with reference to FIGS. 1 to 18A and 18B. Also, a radiation detector manufactured by the manufacturing method of this embodiment and a radiation imaging apparatus and radiation imaging system using this radiation detector will be explained. FIG. 1 is a view showing a configuration example of a radiation imaging system SYS using a radiation imaging apparatus 120 including a radiation detector 100 (shown in drawings from FIG. 2) according to this embodiment.

The radiation imaging system SYS includes a radiation imaging apparatus 120, a radiation source 130 for emitting radiation to the radiation imaging apparatus 120, and a system controller 140. The radiation imaging apparatus 120 detects the radiation emitted from the radiation source 130 through a subject 110. The radiation imaging apparatus 120 includes a radiation detector 100 for detecting radiation, and can further include a signal processor for processing an output signal from the radiation detector 100. This signal processor can output a signal detected by the radiation detector 100 to the system controller 140, and the system controller 140 can generate radiation image data by performing desired arithmetic processing. The radiation image data can be transmitted to, for example, a display device 141 and displayed as a radiation image. The system controller 140 controls the whole radiation imaging system SYS, such as the radiation imaging apparatus 120 and the radiation source 130. A configuration like this can perform, for example, diagnosis on the subject 110.

Figure 2:
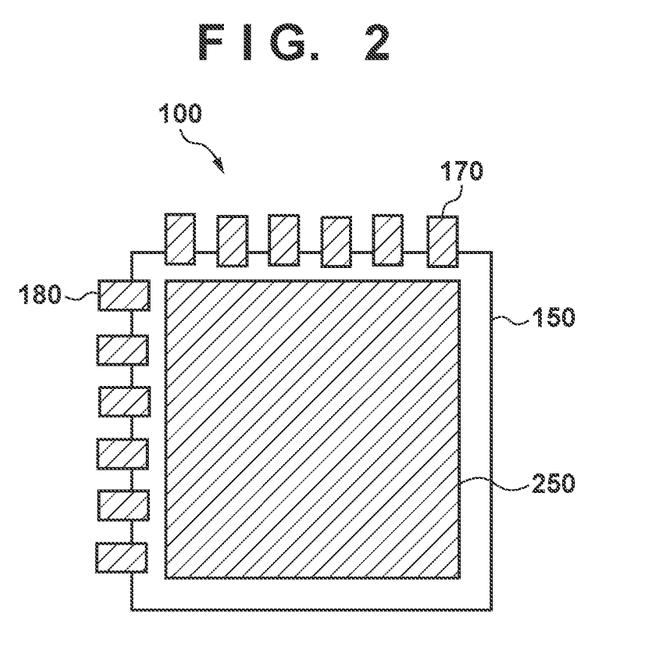
FIG. 2 is a view showing a configuration example of the radiation detector shown in FIG. 1.

FIG. 2 is a view showing a configuration example of the radiation detector 100 included in the radiation imaging apparatus 120. The radiation detector 100 includes a flexible base member 150 having a principal surface 151 (shown in drawings from FIG. 6) including a pixel region 160 (shown in drawings from FIG. 3) in which a plurality of pixels 200 (shown in FIG. 3) are arranged, a scintillator 230 (shown in drawings from FIG. 6) arranged so as to cover the pixel region 160, and a protective layer 250 arranged so as to cover the scintillator 230. The radiation detector 100 can also include wiring boards 170 and 180 that are connected to the outer edge portions of the flexible base member 150 and operate the plurality of pixels arranged in the pixel region 160. For example, the wiring board 170 transfers an output signal from the pixel region 160 to the above-described signal processor or the like, and the wiring board 180 transfers a control signal from the above-described system controller 140 to a pixel arranged in the pixel region 160.

Figure 3:
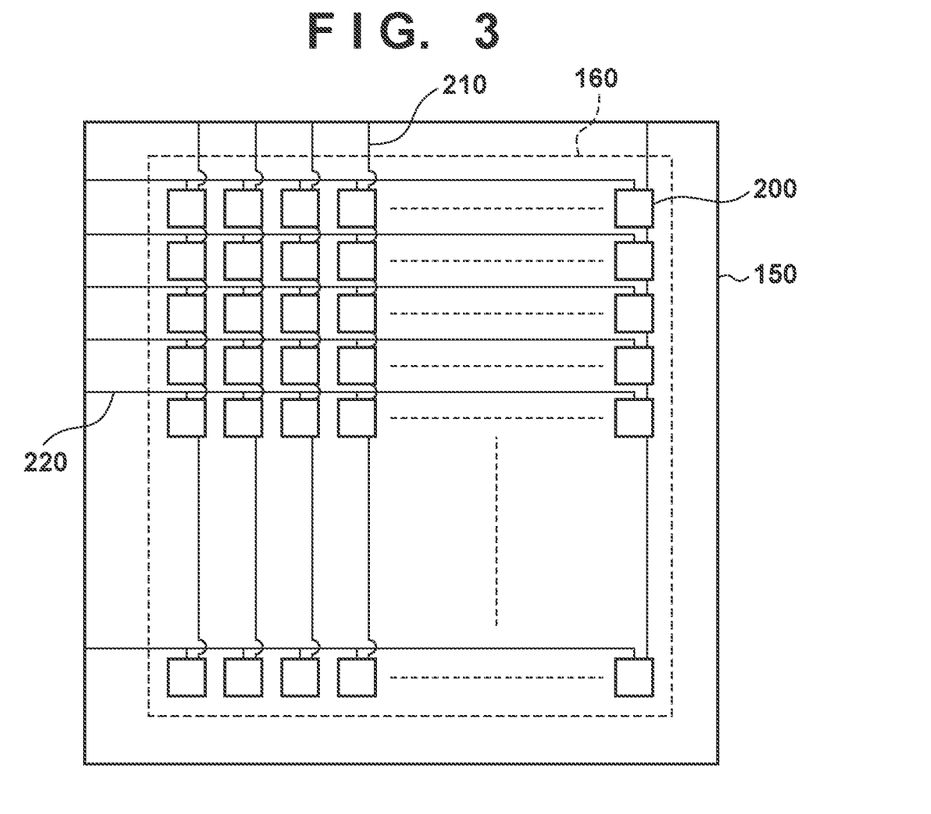
FIG. 3 is a plan view showing a configuration example of a pixel region of the radiation detector shown in FIG. 1.

FIG. 3 is a plan view showing a configuration example of the pixel region 160. In the pixel region 160, the plurality of pixels 200 are arranged in the form of an array. The pixel 200 includes a photoelectric conversion element having sensitivity to light converted from radiation by the scintillator 230. The pixel 200 is connected to a signal read line 210 for outputting a signal from the pixel 200, and the signal read line 210 is connected to the wiring board 170. The pixel 200 is also connected to a control line 220 for controlling the operation of the pixel 200, and the control line 220 is connected to the wiring board 180.

Figure 4:
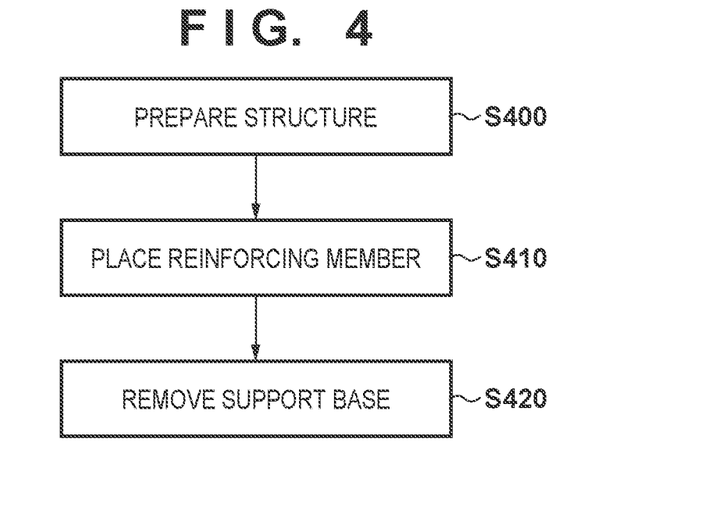
FIG. 4 is a flowchart showing a method of manufacturing the radiation detector shown in FIG. 1.

Next, a method of manufacturing the radiation detector 100 will be explained with reference to FIGS. 4 to 7. FIG. 4 is a flowchart showing the method of manufacturing the radiation detector 100. FIGS. 5A to 5E and 6 are sectional views showing steps of manufacturing the radiation detector 100. In each sectional view shown in drawings including FIGS. 5A to 5E and 6, the control line 220 is shown on the left-hand side. However, the principal surface 151 of the flexible base member 150 may also be exposed without arranging the control line 220, or the signal read line 210 may also be arranged on the principal surface 151 of the flexible base member 150.

Figure 5A:
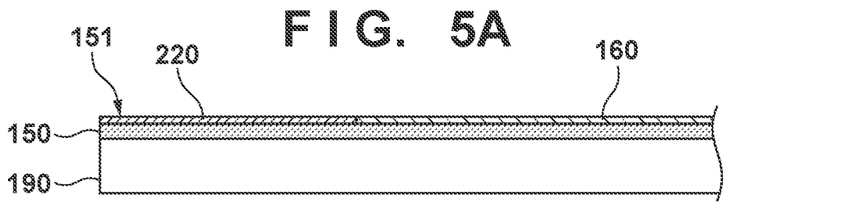
FIGS. 5A to 5E are sectional views showing the method of manufacturing the radiation detector shown in FIG. 1.
Figure 5B:
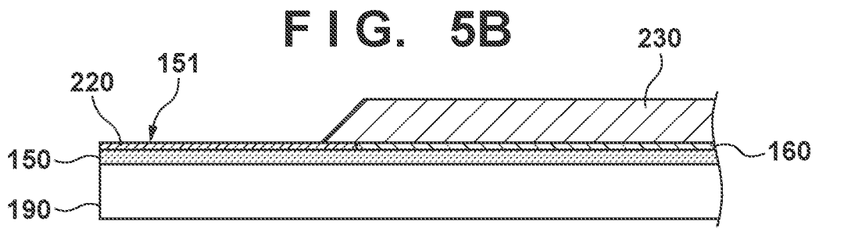
Figure 5C:
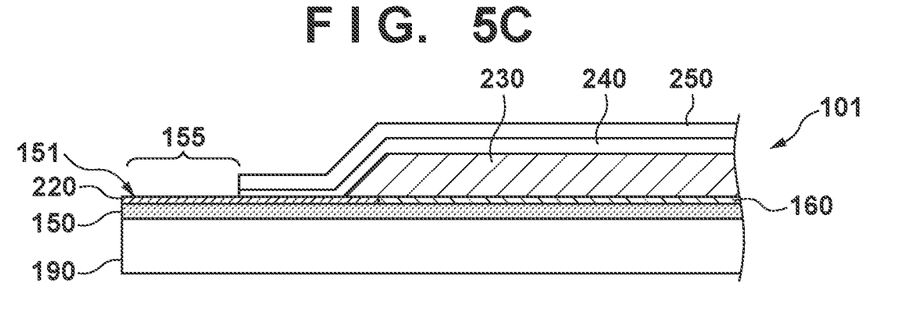

First, in S400, a step of preparing a structure 101 shown in FIG. 5C is performed. The structure 101 includes a support base 190, the flexible base member 150 arranged on the support base 190 and having the principal surface 151 including the pixel region 160 where the plurality of pixels 200 are arranged, the scintillator 230 arranged so as to cover the pixel region 160, and the protective layer 250 arranged so as to cover the scintillator 230.

The structure 101 can be prepared by, for example, steps to be explained below. First, the flexible base member 150 and the support base 190 for supporting the flexible base member 150 are prepared. As the support base 190, a material that has high rigidity and can withstand the formation temperature of photoelectric conversion elements and switching elements such as thin film transistors (TFT) included in the pixels 200 arranged in the pixel region 160 is used. For example, a transparent insulating substrate such as glass or ceramics can be used as the support base 190. The flexible base member 150 is arranged on the support base 190. As the flexible base member 150, a material that can withstand the formation temperature of the photoelectric conversion elements and the switching elements included in the pixels 200 is used. Also, as the flexible base member 150, a material by which impact resistance is obtained when the radiation detector 100 is manufactured and used and flatness is obtained when the radiation detector 100 is manufactured is selected. For example, an organic insulating resin such as polyimide can be used as the flexible base member 150. The support base 190 and the flexible base member 150 can also be adhered to each other. The flexible base member 150 can also be formed by, for example, coating the support base 190 with a resin material that forms the flexible base member 150. Then, the pixel region 160 is formed on the principal surface 151 of the flexible base member 150. In addition, the signal read lines 210, the control lines 220, and the like are formed on the principal surface 151 of the flexible base member 150. FIG. 5A shows a section in which the pixel region 160, the signal read lines 210, the control lines 220, and the like are formed on the principal surface 151 of the flexible base member 150.

Subsequently, as shown in FIG. 5B, the scintillator 230 is arranged so as to cover the pixel region 160. As shown in FIG. 5B, the scintillator 230 can be formed in a region wider than the pixel region 160. The scintillator 230 converts incident radiation into light to which the photoelectric conversion elements arranged in the pixels 200 have sensitivity. For example, the scintillator 230 can convert radiation into visible light. As the scintillator 230, it is possible to use, for example, a mixture formed by mixing phosphor particles such as gadolinium oxysulfide (GOS) and a binder, or cesium iodide (CsI) obtained by activating thallium (Tl). When using the mixture containing GOS as the scintillator 230, the scintillator 230 is formed by a method of applying the mixture on the pixel region 160, or a method of adhering a sheet of the mixture. When using CsI as the scintillator 230, the scintillator 230 can also be formed by growing a plurality of columnar CsI crystals having a diameter of about 1 to a several tens of microns on the pixel region 160, to a desired thickness by using vacuum deposition. The feature of CsI is that air gaps exist between the columnar crystals and the sharpness improves when light converted from radiation passes through the crystals as the light is reflected in the crystals. When using CsI as the scintillator 230, CsI formed on another base member can be adhered on the flexible base member 150, instead of the method of directly growing CsI on the flexible base member 150 as described above. In the structure shown in FIG. 5B, the scintillator 230 using CsI as the material is directly formed on the pixel region 160.

After the scintillator 230 is formed, as shown in FIG. 5C, the protective layer 250 is arranged so as to cover the scintillator 230. The protective layer 250 covers the scintillator 230 via an adhesive layer 240. Also, the protective layer 250 and the adhesive layer 240 are arranged to the outside of the outer edge of the scintillator 230, and cover a part of the principal surface 151 of the flexible base member 150. CsI used as the scintillator 230 in this embodiment deliquesces by water, and sharpness important as the performance of the radiation detector 100 may decrease if CsI deliquesces. More specifically, if the columnar crystals of CsI deliquesce by water, adjacent crystals come in contact with each other, and light converted from radiation in a given columnar crystal is transmitted and scattered to other columnar crystals. To prevent the deliquescence of the scintillator 230, the protective layer 250 having moisture resistance is formed not only on the surface of the scintillator 230 but also in a region reaching the principal surface 151 of the flexible base member 150 outside the outer edge of the scintillator 230.

Another requirement for the protective layer 250 is the rigidity of the protective layer 250 itself. The rigidity changes in accordance with the material, the thickness, and the shape. In this embodiment, the protective layer 250 is formed to have substantially the same thickness as that of the shape of the object to be covered. Since this excludes the shape requirement, the rigidity of the protective layer 250 depends on the material and the thickness. Since the flexible base member 150 is released from the support base 190 in a later step, the rigidity of the protective layer 250 can be lower than the total rigidity of the flexible base member 150 and the scintillator 230. For example, as the protective layer 250, it is possible to use metal materials such as Al, Au, Ag, Cr, Pt, Ti, Mg, Ce, Na, Si, and Ca and oxide compounds thereof having a thickness on the order of microns. Furthermore, an organic material such as a paraxylylene-based polymer can also be used as the protective layer 250.

The structure 101 shown in FIG. 5C is prepared by using the above-described steps and the like. A region of the principal surface 151 of the flexible base member 150, which is not covered with the protective layer 250 as shown in FIG. 5C, will be called a peripheral region 155. In the peripheral region 155, the principal surface 151 and the above-described signal read lines 210 and control lines 220 can be exposed.

Figure 5D:
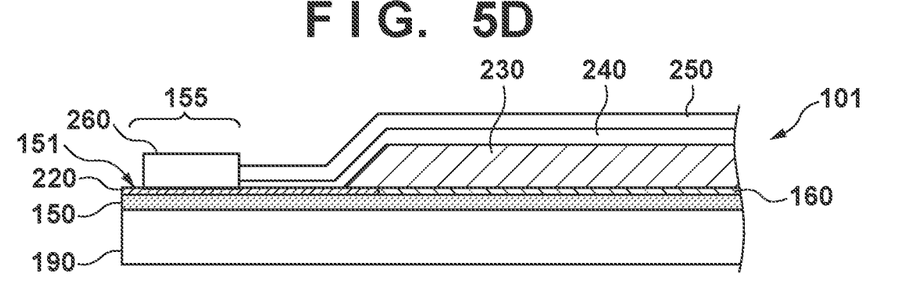

When the structure 101 is prepared in S400, the process advances to S410, and a reinforcing member 260 is placed. In orthogonal projection to the principal surface 151 of the flexible base member 150, the reinforcing member 260 is arranged in a position overlapping the peripheral region 155 and not overlapping the scintillator 230. In a removal step of removing the support base 190 from the flexible base member 150, the peripheral region 155 in which the scintillator 230 and the protective layer 250 are unmounted deforms most easily. If the flexible base member 150 deforms, the yield of the manufacturing process of the radiation detector 100 may be decreased because, for example, wiring patterns such as the signal read lines 210 and the control lines 220 arranged in the peripheral region 155 are cracked and disconnected. Therefore, the reinforcing member 260 is arranged in the peripheral region 155. As shown in FIG. 5D, the reinforcing member 260 is in contact with the peripheral region 155. A state in which the reinforcing member 260 is in contact with the peripheral region 155 can include a state in which the reinforcing member 260 is fixed to the peripheral region 155, for example, the reinforcing member 260 is adhered or connected to the peripheral region 155. This similarly applies to an expression "the reinforcing member 260 is in contact with another constituent element".

The material of the reinforcing member 260 is so selected as to reduce bend or deformation of the flexible base member 150 in a region of the flexible base member 150 in which the reinforcing member 260 is arranged. For example, a material having rigidity higher than that of the flexible base member 150 can be used as the reinforcing member 260. As the reinforcing member 260, a resin plate or the like can be adhered on the principal surface 151 of the flexible base member 150. Furthermore, the reinforcing member 260 can be formed by applying a resin on the principal surface of the flexible base member 150 and curing the resin. As an example, Epoxy Resin EP001K manufactured by Cemedine has a tensile shear strength of 6.13 MP and a linear expansion coefficient of $1.53 \times 10^{-4}$, so bending and deformation were small in the application portion, and good results were obtained as the reinforcing member 260.

Figure 6:
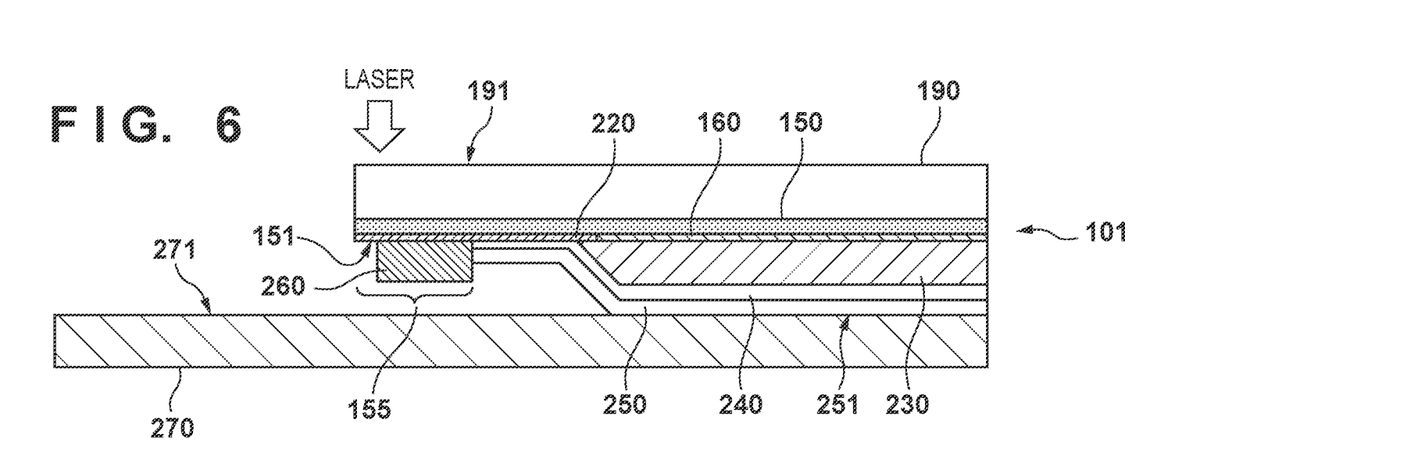
FIG. 6 is a sectional view showing the method of manufacturing the radiation detector shown in FIG. 1.

After the reinforcing member 260 is arranged, the process advances to S420, and a removal step of removing the support base 190 from the flexible base member 150 is performed. This removal step can be performed by using laser emission as shown in FIG. 6. As shown in FIG. 6, a laser is emitted from a principal surface 191 side opposite to the principal surface of the support base 190 on which the flexible base member 150 is arranged. The laser is condensed in order to increase the energy, and laser emission for removing the support base 190 can be performed by two-dimensionally scanning the entire surface of the support base 190.

Since the laser is emitted from the principal surface 191 side of the support base 190, the removal step is performed by placing the structure 101 in which the reinforcing member 260 is arranged on a stage 270, as shown in FIG. 6. More specifically, the structure 101 is so placed that the principal surface 151 of the flexible base member 150 faces a placement surface 271 of the stage 270 on which the structure 101 is placed. Therefore, if the reinforcing member 260 is higher than the stacked structure of the scintillator 230, the adhesive layer 240, and the protective layer 250, a central portion of the scintillator 230 may deform and damage the columnar crystals during the removal step. Accordingly, the protective layer 250 can have an upper surface 251 in a position furthest from the principal surface 151 of the flexible base member 150, and the reinforcing member 260 can be arranged nearer to the principal surface 151 side of the flexible base member 150 than a virtual surface 252 (shown in FIG. 5E) including the upper surface 251 and parallel to the principal surface 151 of the flexible base member 150. In the state shown in FIG. 6, the virtual surface 252 can exist in the same position as that of the placement surface 271 of the stage 270.

Figure 5E:
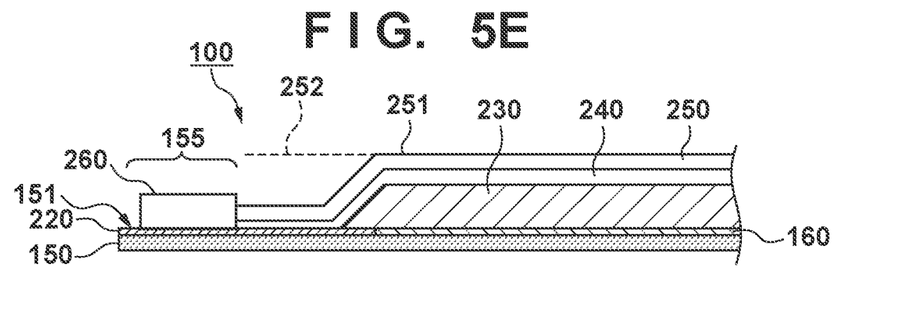

FIG. 5E shows a section of the radiation detector 100 after the support base 190 is removed. When removing the support base 190, deformation of the flexible base member 150 can be suppressed by arranging the reinforcing member 260. In the removal step, therefore, bending of the peripheral region 155 of the flexible base member 150 is suppressed, so the wiring patterns such as the signal read lines 210 and the control lines 220 are less likely to become disconnected. That is, the yield of the manufacturing process of the radiation detector 100 improves, and as a consequence the quality of the radiation detector 100 can be improved.

Figure 7:
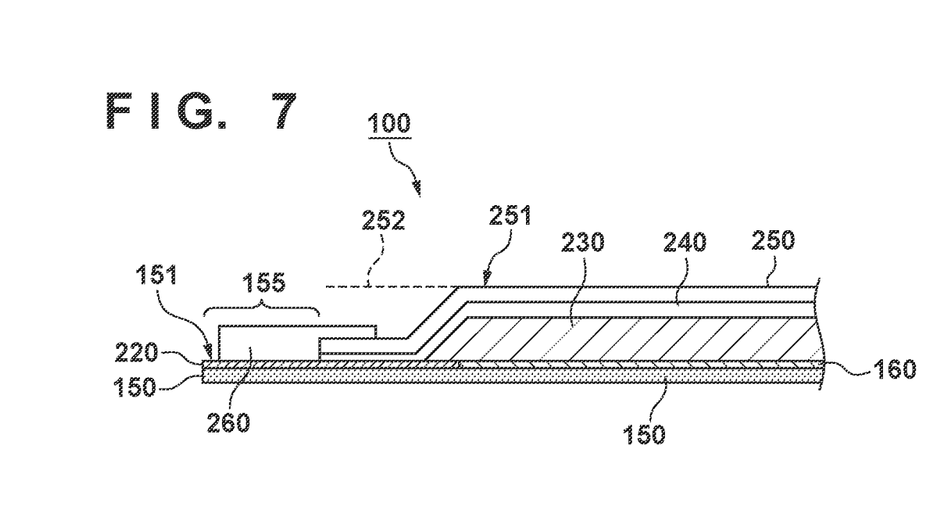
FIG. 7 is a view showing a modification of a reinforcing member of the radiation detector shown in FIG. 1.

FIG. 7 is a view showing a modification of the radiation detector 100 shown in FIG. 5E. The difference of the radiation detector 100 shown in FIG. 7 from the radiation detector 100 shown in FIG. 5E is the shape of the reinforcing member 260. The rest of the configuration can be the same as that of the radiation detector 100 described above, so an explanation of the configuration except the reinforcing member 260 will be omitted.

In the radiation detector 100 shown in FIG. 7, the reinforcing member 260 overlaps the protective layer 250 in orthogonal projection to the principal surface 151 of the flexible base member 150. In addition, the reinforcing member 260 is in contact with the protective layer 250. In this configuration shown in FIG. 7, the reinforcing member 260 is arranged so as to connect the protective layer 250 and the peripheral region 155 of the flexible base member 150. This makes it possible to suppress bending and deformation near the outer edge of the protective layer 250. Even in this case, the reinforcing member 260 can be arranged nearer to the principal surface 151 side of the flexible base member 150 than the virtual surface 252 including the upper surface 251 of the protective layer 250 and parallel to the principal surface 151 of the flexible base member 150.

Figure 8:
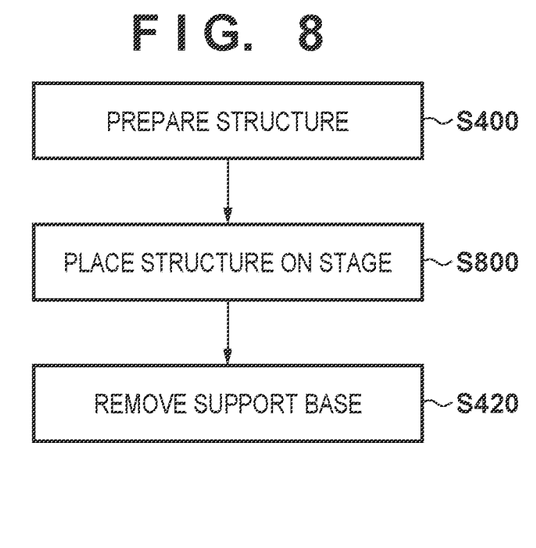
FIG. 8 is a flowchart showing a method of manufacturing the radiation detector shown in FIG. 1.

Another manufacturing method that suppresses deformation of the flexible base member 150 in the removal step of removing the support base 190 from the flexible base member 150 will be explained below with reference to FIGS. 8 to 10. FIG. 8 is a flowchart showing the method of manufacturing the radiation detector 100. Compared to the flowchart shown in FIG. 4, the step of placing the reinforcing member 260 in S410 is changed to a step of placing the structure 101 on a stage 290 (shown in FIG. 9) in S800. The rest of the configuration such as the structure 101 and steps can be the same as those of the manufacturing method explained above with reference to FIGS. 4 to 7, so the difference will mainly be explained below.

The placement step of placing the structure 101 on the stage 290 before the removal step (S420) in S800 will be explained with reference to FIG. 9. FIG. 9 is a view for explaining the placement step and the removal step when manufacturing the radiation detector 100. In the placement step, the structure 101 is placed such that the principal surface 151 of the flexible base member 150 faces a placement surface 291 of the stage 290 on which the structure 101 is placed. A convex portion 300 is arranged on the placement surface 291 of the stage 290 so as to extend from the placement surface 291 to the peripheral region 155, in a position where the convex portion 300 overlaps the peripheral region 155 and does not overlap the scintillator 230 in orthogonal projection to the principal surface 151 of the flexible base member 150. As shown in FIG. 9, the convex portion 300 of the stage 290 can be in contact with the peripheral region 155 of the flexible base member 150. Also, the peripheral region 155 of the flexible base member 150 can be fixed to the convex portion 300 of the stage 290.

When the structure 101 is placed on the stage 290, the process advances to S420, and the removal step of removing the support base 190 from the flexible base member 150 is performed with the structure 101 being placed on the stage 290. In this removal step, laser emission can be used as shown in FIG. 9. FIG. 10 shows a section of the radiation detector 100 after the removal step.

The convex portion 300 can suppress deformation of the flexible base member 150 when removing the support base 190 in this embodiment as well. In the removal step, therefore, bending of the peripheral region 155 of the flexible base member 150 is suppressed, and the wiring patterns such as the signal read lines 210 and the control lines 220 are less likely to become disconnected. That is, the yield of the manufacturing process of the radiation detector 100 improves, and as a consequence the quality of the radiation detector 100 can be improved.

Figure 9:
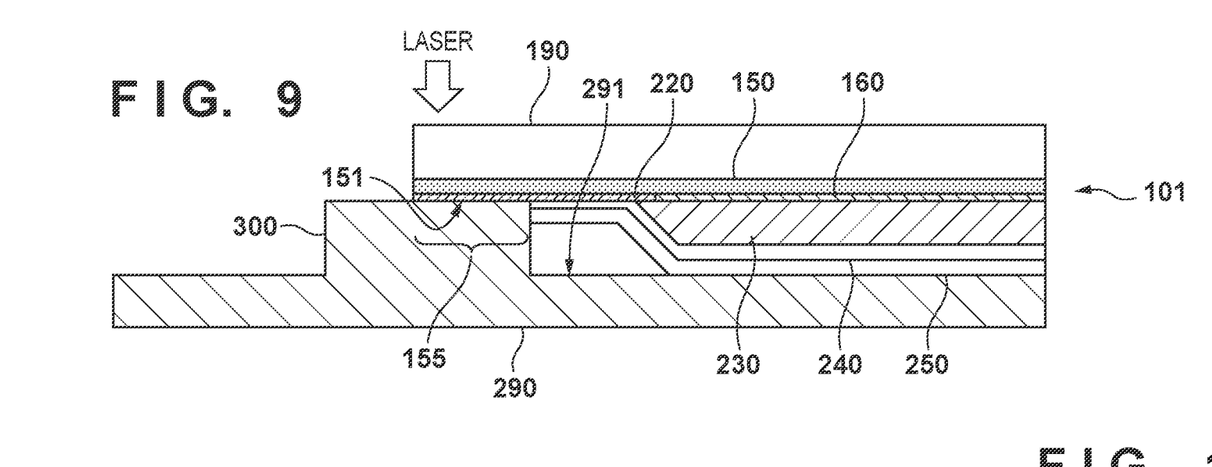
FIG. 9 is a sectional view showing the method of manufacturing the radiation detector shown in FIG. 1.
Figure 10:
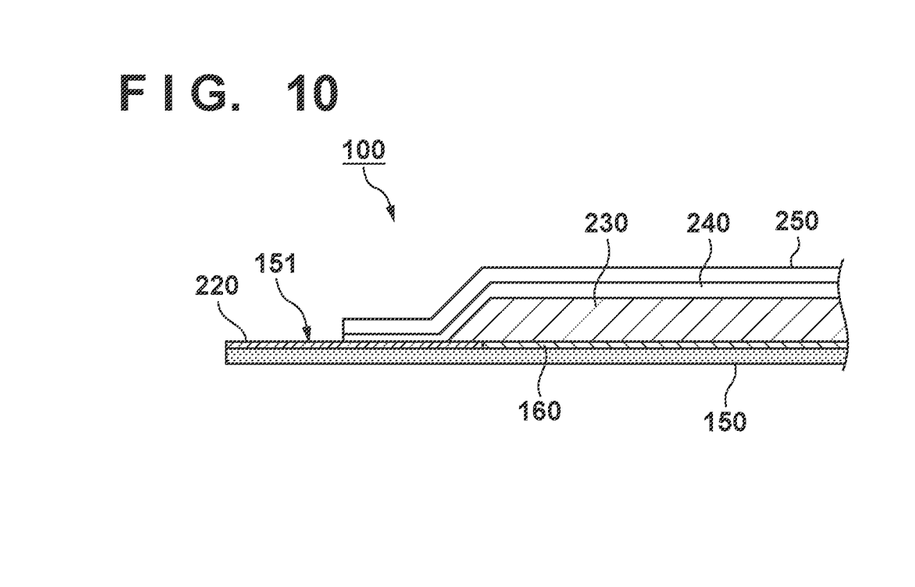
FIG. 10 is a sectional view of the radiation detector shown in FIG. 1.

Also, when using the manufacturing method shown in FIGS. 8 and 9, the step of forming the reinforcing member 260 described above can be omitted from the manufacturing process of the radiation detector 100. That is, it is possible not only to suppress bending and deformation of the flexible base member 150 in the removal step, but also to reduce the manufacturing cost because the reinforcing member 260 is unnecessary.

Figure 11:
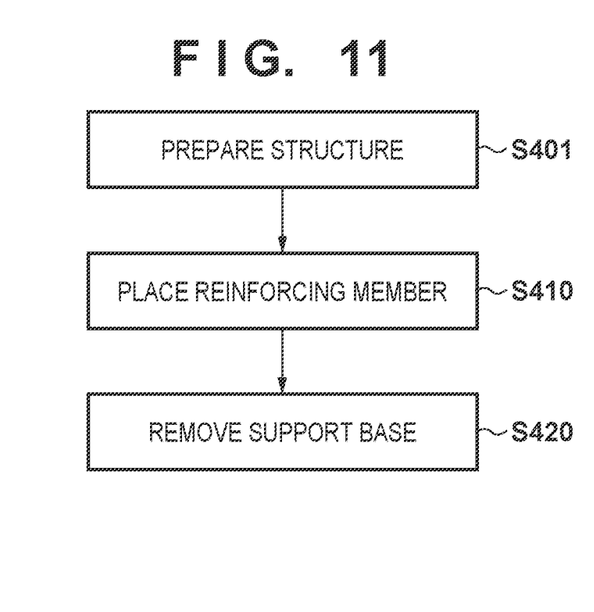
FIG. 11 is a flowchart showing a method of manufacturing the radiation detector shown in FIG. 1.
Figure 12A:
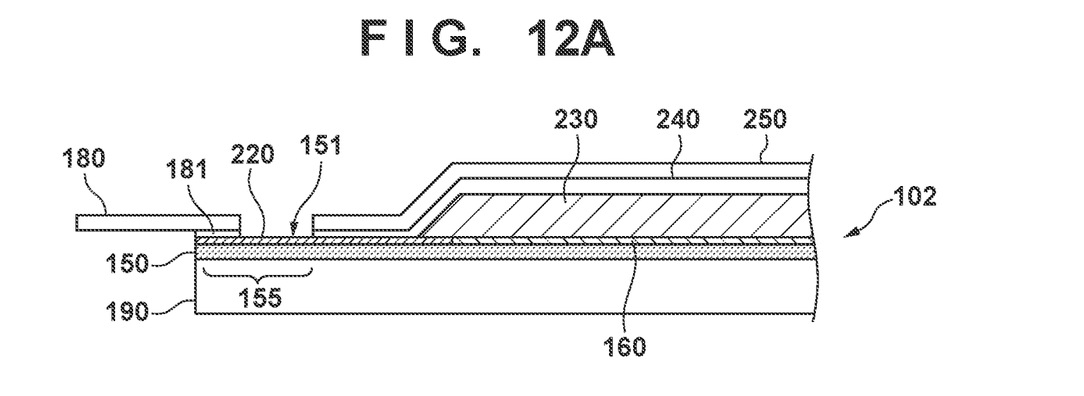
FIGS. 12A to 12C are sectional views showing the method of manufacturing the radiation detector shown in FIG. 1.
Figure 12B:
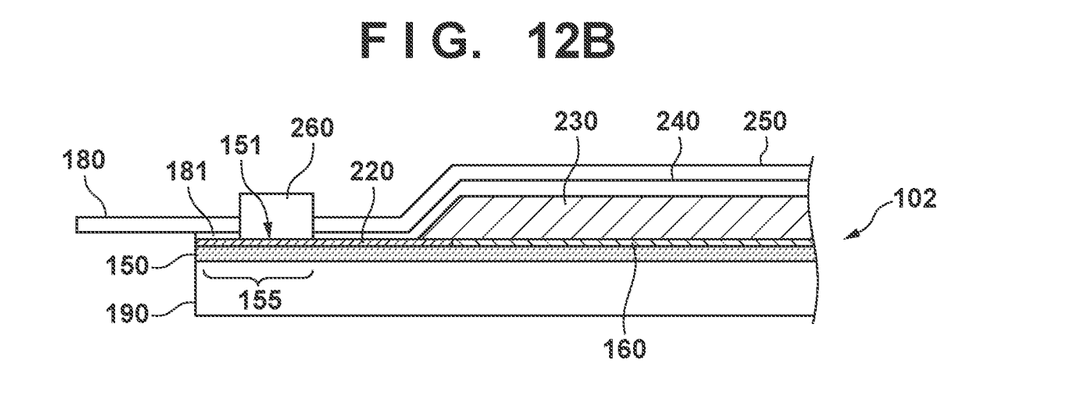
Figure 12C:
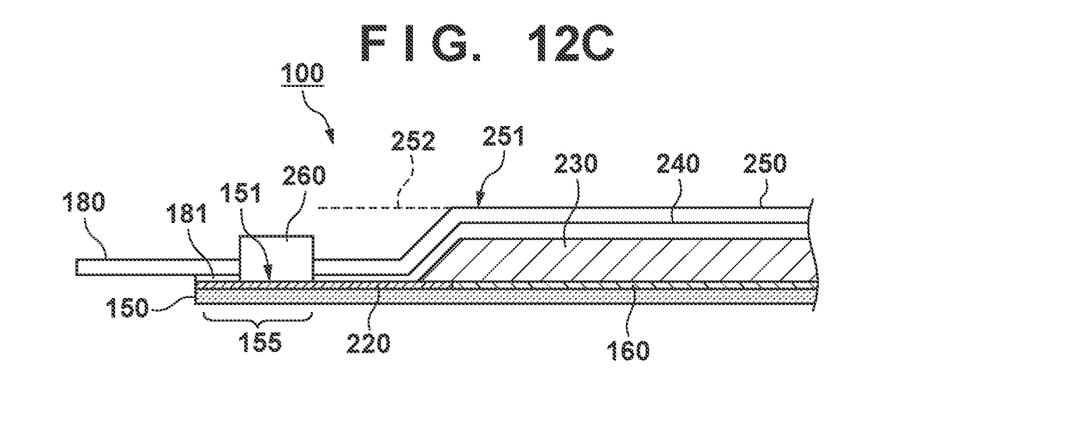

The radiation detector 100 and a method of manufacturing the radiation detector 100 will be explained below with reference to FIGS. 11 to 13A and 13B. FIG. 11 is a flowchart showing the manufacturing method of the radiation detector 100. FIGS. 12A to 12C are sectional views showing manufacturing steps of the radiation detector 100. In this embodiment, in the structure preparation step in S401, a structure 102 different from the structure 101 described above is prepared.

FIG. 12A shows the structure 102. Compared to the structure 101 shown in FIG. 5C, the structure 102 further includes a wiring board 180 connected to the outer edge portion of the principal surface 151 of the flexible base member 150. The wiring board 180 is electrically connected to the signal read line 210 and the control line 220 via a bump 181 or the like. An output signal from the pixel 200, a signal for controlling the pixel 200, and the like are transmitted via the wiring board 180.

After the structure 102 is prepared, the reinforcing member 260 is arranged in the peripheral region 155 of the flexible base member 150 in S410. As shown in FIG. 12B, the reinforcing member 260 is arranged in a region of the peripheral region 155 of the flexible base member 150, which is not covered with the wiring board. This is so because the reinforcing member 260 is arranged after the structure 102 in which the wiring board 180 is already connected to the flexible base member 150 via the bump 181 or the like is prepared. As shown in FIG. 12B, the reinforcing member 260 is in contact with the peripheral region 155 of the flexible base member 150.

In this embodiment, the wiring board 180 can be connected to the flexible base member 150 in a state in which the support base 190 having high rigidity exists below the flexible base member 150, unlike the manufacturing process described above. Therefore, when connecting the wiring board 180 to the signal read line 210 and the control line 220 formed on the flexible base member 150, it is possible to suppress deformation of the flexible base member 150 and precisely connect the wiring board 180 to the signal read line 210 and the control line 220. Also, the reinforcing member 260 is formed in the peripheral region 155 of the flexible base member 150 in this embodiment as well. Accordingly, as in the above-described manufacturing process, bending and deformation of the flexible base member 150 can be suppressed in the removal step of removing the support base 190 from the flexible base member 150. That is, the yield of the manufacturing process of the radiation detector 100 improves, and as a consequence the quality of the radiation detector 100 can be improved.

Figure 13A:
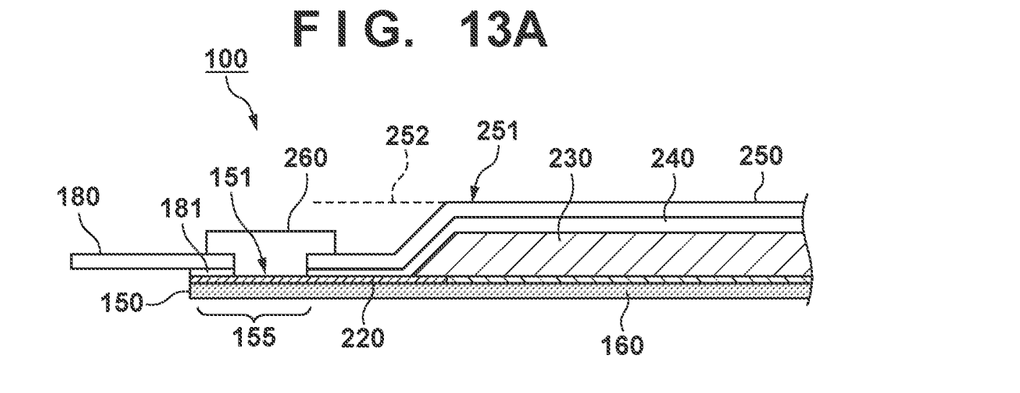
FIGS. 13A and 13B are views showing modifications of a reinforcing member of the radiation detector shown in FIG. 1.

As shown in FIG. 7, the reinforcing member 260 can have a portion overlapping the protective layer 250 in orthogonal projection to the principal surface 151 of the flexible base member 150 and come in contact with the protective layer 250, in this embodiment as well. Also, the reinforcing member 260 can include a portion overlapping the wiring board 180 in orthogonal projection to the principal surface 151 of the flexible base member 150 and come in contact with the wiring board 180, instead of the protective layer 250. Furthermore, as shown in FIG. 13A, the reinforcing member 260 can have portions overlapping the protective layer 250 and the wiring board 180 in orthogonal projection to the principal surface 151 of the flexible base member 150 and come in contact with the protective layer 250 and the wiring board 180. Since the reinforcing member 260 comes in contact with the wiring board 180 and the protective layer 250, bending and deformation of the flexible base member 150 can be suppressed more in the removal step.

After the reinforcing member is arranged in the structure 102, the removal step is performed in S420, thereby forming the radiation detector 100 as shown in FIGS. 12C and 13A. Even in this case, the reinforcing member 260 can be arranged nearer to the principal surface 151 side of the flexible base member 150 than the virtual surface 252 including the upper surface 251 of the protective layer 250 and parallel to the principal surface 151 of the flexible base member 150.

Figure 13B:
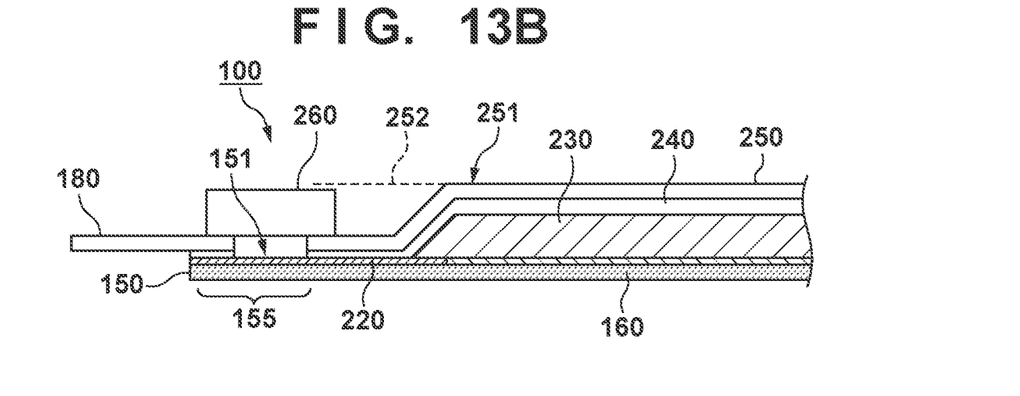

In the structure 102, the reinforcing member 260 need not be in contact with the peripheral region 155. For example, as in the configuration shown in FIG. 13A, the reinforcing member 260 is arranged in a position overlapping the peripheral region 155, the protective layer 250, and the wiring board 180 and not overlapping the scintillator 230, in orthogonal projection to the principal surface 151 of the flexible base member 150. In this state, as shown in FIG. 13B, the reinforcing member 260 is in contact with the protective layer 250 and the wiring board 180 and need not be in contact with the peripheral region 155. In this case, the reinforcing member 260 is made of a material having higher rigidity than that in the case shown in FIG. 13A. In the removal step, the reinforcing member 260 shown in FIG. 13B can also suppress bending and deformation of the flexible base member 150. In addition, even in this case, the reinforcing member 260 can be arranged nearer to the principal surface 151 side of the flexible base member 150 than the virtual surface 252 including the upper surface 251 of the protective layer 250 and parallel to the principal surface 151 of the flexible base member 150.

Figure 14:
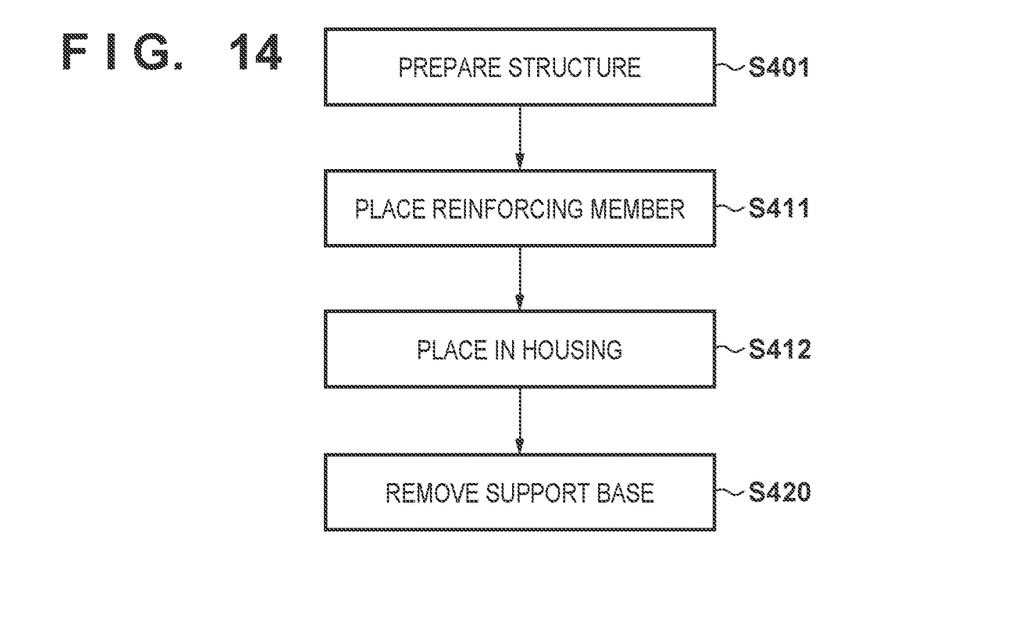
FIG. 14 is a flowchart showing a method of manufacturing the radiation detector shown in FIG. 1.
Figure 15A:
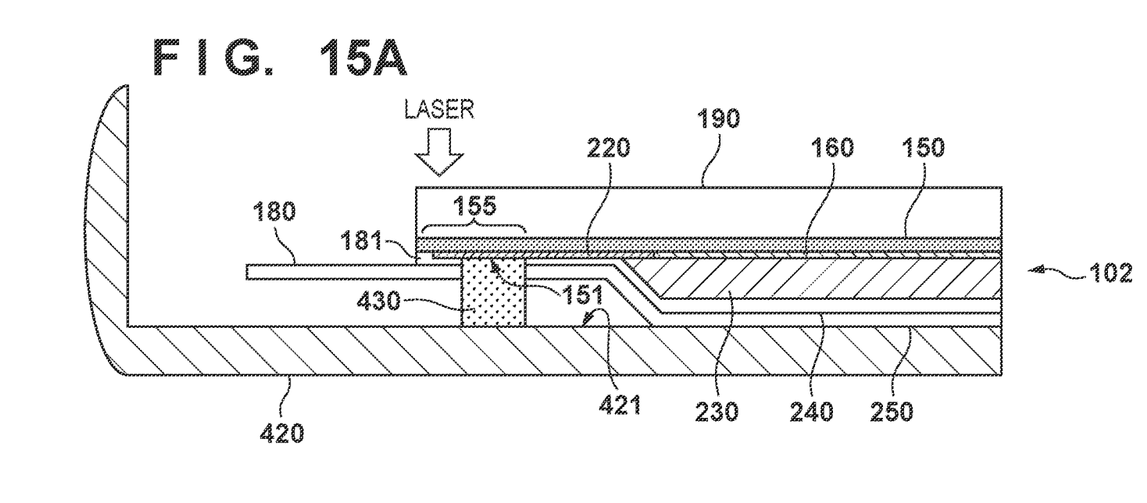
FIGS. 15A and 15B are sectional views showing the method of manufacturing the radiation detector shown in FIG. 1.
Figure 15B:
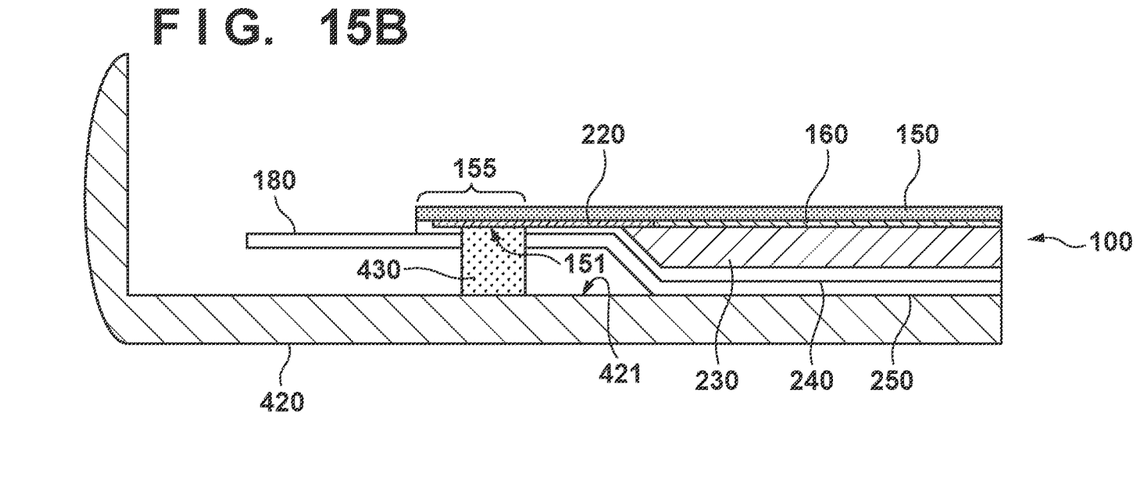

Next, the radiation detector 100 and a method of manufacturing the radiation detector 100, which is different from the method described above, will be explained with reference to FIGS. 14, 15A, and 15B. FIG. 14 is a flowchart showing the manufacturing method of the radiation detector 100. FIGS. 15A and 15B are sectional views showing manufacturing steps of the radiation detector 100.

In this embodiment, the above-described structure 102 is prepared in S401. Then, a reinforcing member 430 is arranged in S411, and the structure 102 is placed in a housing 420 in S412. In S411, it is also possible, for example, to arrange the reinforcing member 430 on a placement surface 421 of the housing 420, on which the structure 102 is to be placed, and then place the structure 102 on the placement surface 421 of the housing 420. As another example, it is possible to arrange the reinforcing member 430 on the structure 102, and then place the structure 102 on the placement surface 421 of the housing 420.

FIG. 15A is a sectional view showing a state in which the structure 102 is placed in the housing 420 in S412. The principal surface 151 of the flexible base member 150 is so positioned as to face the placement surface 421. The reinforcing member 430 is arranged between the peripheral region 155 and the placement surface 421.

FIG. 15B shows the radiation detector 100 after the removal step of removing the support base 190 from the flexible base member 150 shown in S420. As in each of the above-described embodiments, bending and deformation of the flexible base member 150 can be suppressed in the removal step by arranging the reinforcing member 430, in this embodiment as well. In addition, in this embodiment, the reinforcing member 430 can be in contact with the placement surface 421. In other words, the reinforcing member 430 can be fixed on the placement surface 421. Consequently, subsequent steps can be performed after the structure 102 (the radiation detector 100) is placed in the housing 420 having high rigidity. Since this remarkably improves the handling ability when manufacturing the radiation detector 100, it is possible to prevent the occurrence of damage and the like during the manufacturing process. As a result, the quality of the radiation detector 100 can be improved.

As described above, defects of the radiation detector 100 to be manufactured are suppressed by placing the structure 102 in the housing 420 via the reinforcing member 430. In other words, therefore, the step of arranging the reinforcing member 430 includes the step of placing the structure 102 in the housing 420. The housing 420 in which the structure 102 is placed can also be used as the exterior of the radiation imaging apparatus 120. In addition, a resin material as described above is used as the reinforcing member 430. However, the reinforcing member 430 can also be formed by using, for example, the same material as that used for the housing 420.

Furthermore, FIGS. 15A and 15B illustrate a structure equal to that shown in FIGS. 12B and 12C, as the structure of the reinforcing member 430 on the side of the structure 102. However, the present invention is not limited to this. As described above, the reinforcing member 430 can be in contact with the protective layer 250, in contact with the wiring board 180, and in contact with both the protective layer 250 and the wiring board 180. Also, as shown in FIG. 13B, the reinforcing member 430 can be in contact with the protective layer 250 and the wiring board 180, and need not be in contact with the peripheral region 155.

Figure 16:
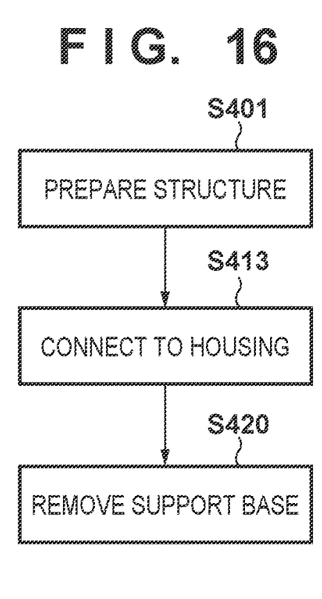
FIG. 16 is a flowchart showing a method of manufacturing the radiation detector shown in FIG. 1.

Modifications of the radiation detector 100 and the manufacturing method of the radiation detector 100 explained with reference to FIGS. 14, 15A, and 15B will be explained below with reference to FIGS. 16 to 18A and 18B. FIG. 16 is a flowchart showing the manufacturing method of the radiation detector 100. FIGS. 17A, 17B, 18A, and 18B are sectional views showing manufacturing steps of the radiation detector 100.

This embodiment differs from the housing 420 explained with reference to FIGS. 15A and 15B in that a reinforcing member 450 projects from a placement surface 441 of a housing 440 like the convex portion 300 of the stage 290 described earlier. The rest of the configuration can be the same as that shown in FIGS. 14, 15A, and 15B, so an explanation thereof will be omitted.

Figure 17A:
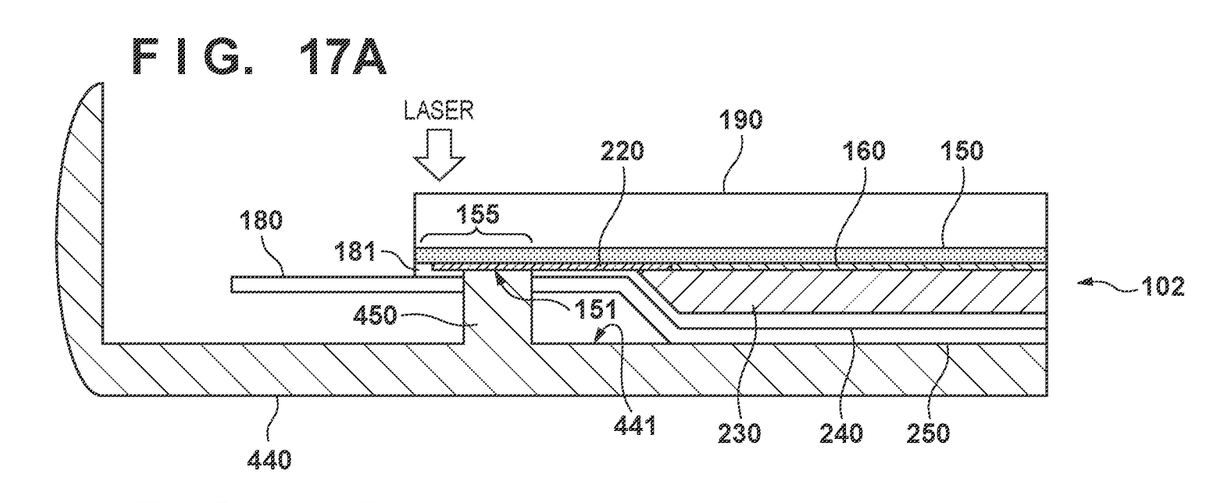
FIGS. 17A and 17B are sectional views showing the method of manufacturing the radiation detector shown in FIG. 1.
Figure 17B:
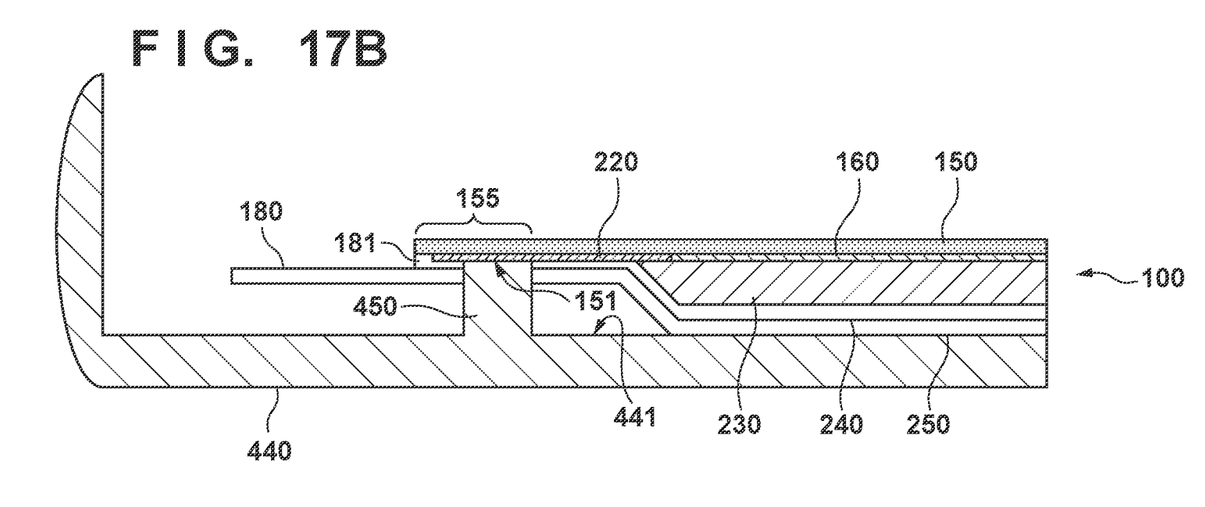

As shown in FIGS. 17A and 17B, the reinforcing member 450 is arranged on the placement surface 441 of the housing 440 so as to extend from the placement surface 421 to a peripheral region, in a position overlapping the peripheral region 155 and not overlapping the scintillator 230, in orthogonal projection to the principal surface 151 of the flexible base member 150. For example, it is possible to integrally mold the reinforcing member 450 with the housing 440. In S413 before S420 in which the removal step is performed, the structure 102 is placed in the housing 440 in which the reinforcing member 450 is formed.

As in each of the above-described embodiments, bending and deformation of the flexible base member 150 can be suppressed in the removal step by arranging the reinforcing member 430, in this embodiment as well. Also, subsequent steps can be performed after the structure 102 (the radiation detector 100) is placed in the housing 420 having high rigidity. Since this remarkably improves the handling ability when manufacturing the radiation detector 100, it is possible to prevent the occurrence of damages and the like during the manufacturing process. As a consequence, the quality of the radiation detector 100 can be improved. In addition, compared to the flowchart shown in FIG. 14, the step of arranging the reinforcing member 430 in S411 is omitted, so it is possible to simplify the process and reduce the cost. Furthermore, since the reinforcing member 450 and the housing 440 are integrally designed and molded, the reinforcing member 450 can precisely be arranged.

Figure 18A:
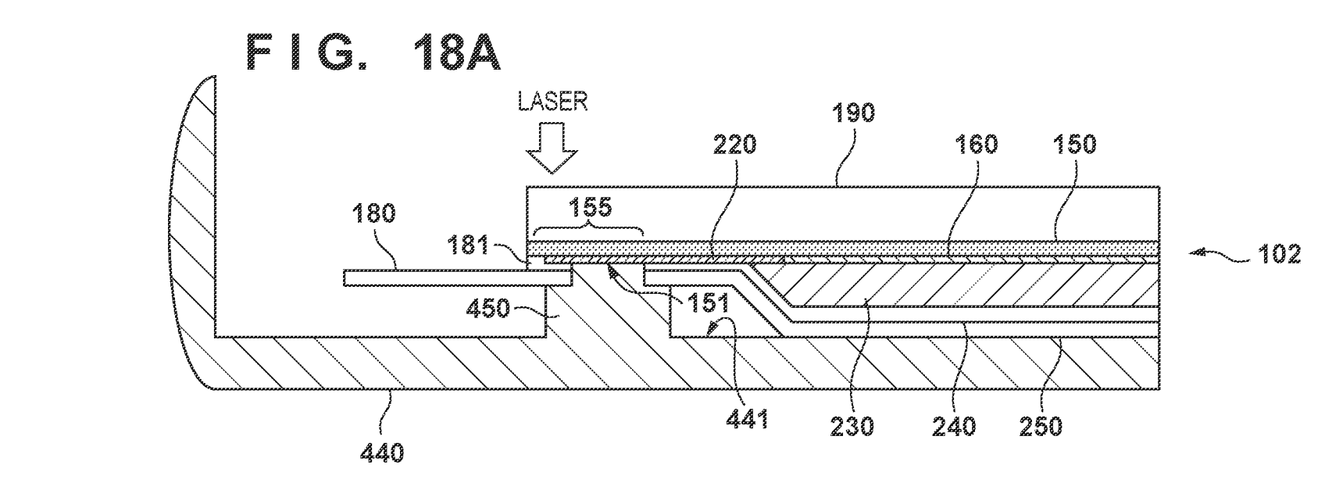
FIGS. 18A and 18B are views showing modifications of a reinforcing member of the radiation detector shown in FIG. 1.
Figure 18B:
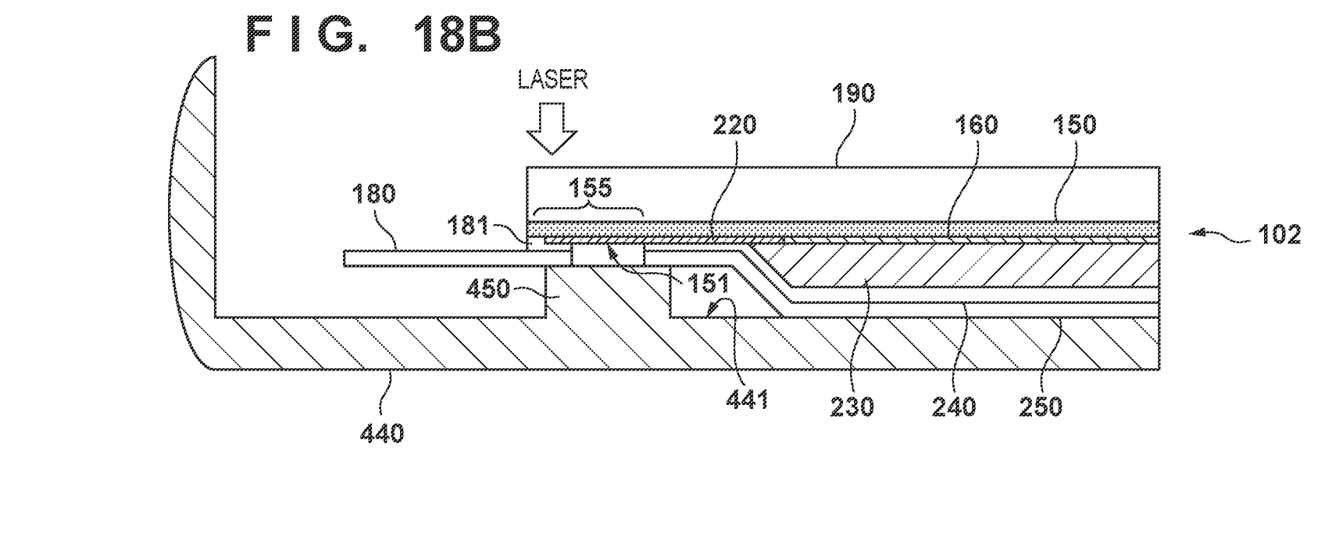

As described above, the reinforcing member 450 can be in contact with the protective layer 250, in contact with the wiring board 180, and in contact with both the protective layer 250 and the wiring board 180 as shown in FIG. 18A. Also, as shown in FIG. 18B, the reinforcing member 450 can be in contact with the protective layer 250 and the wiring board 180, and need not be in contact with the peripheral region 155.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-081073, filed May 17, 2022, which is hereby incorporated by reference herein in its entirety.

What is claimed is:

1. A radiation detector manufacturing method, comprising:
   preparing a structure including a support base, a flexible base member arranged on the support base and having a principal surface including a pixel region in which a plurality of pixels are arranged, a wiring board connected to an outer edge portion of the principal surface, a scintillator arranged so as to cover the pixel region, and a protective layer arranged so as to cover the scintillator; and
   removing the support base from the flexible base member,
   wherein the principal surface includes a peripheral region not covered with the protective layer,
   the method further comprises, before the removing, arranging a reinforcing member in contact with the peripheral region, in a position overlapping the peripheral region and not overlapping the scintillator, in orthogonal projection to the principal surface,
   the reinforcing member is arranged in a region of the peripheral region, which is not covered with the wiring board,
   the reinforcing member overlaps both the protective layer and the wiring board in orthogonal projection to the principal surface, and
   the reinforcing member is further in contact with the protective layer and the wiring board.

2. The method according to claim 1, wherein the protective layer includes an upper surface in a position furthest from the principal surface, and the reinforcing member is arranged nearer to a principal surface side than a virtual surface including the upper surface and parallel to the principal surface.

3. The method according to claim 1, wherein the arranging the reinforcing member includes placing the structure in a housing, the principal surface is arranged so as to face a placement surface of the housing, on which the structure is placed, and the reinforcing member is arranged between the peripheral region and the placement surface.

4. The method according to claim 3, wherein the reinforcing member is in contact with the placement surface.

5. The method according to claim 3, wherein the reinforcing member is integrally molded with the housing.

6. The method according to claim 3, wherein the reinforcing member is formed by the same material as that of the housing.

7. The method according to claim 1, wherein the reinforcing member contains an epoxy resin.

8. The method according to claim 1, wherein in the removing, the support base is removed from the flexible base member by using laser emission.

9. A radiation detector manufacturing method, comprising:

preparing a structure including a support base, a flexible base member arranged on the support base and having a principal surface including a pixel region in which a plurality of pixels are arranged, a scintillator arranged so as to cover the pixel region, a protective layer arranged so as to cover the scintillator, and a wiring board connected to an outer edge portion of the principal surface; and removing the support base from the flexible base member, wherein the principal surface includes a peripheral region not covered with the protective layer, the method further comprises, before the removing, arranging a reinforcing member in a position overlapping the peripheral region, the protective layer, and the wiring board, and not overlapping the scintillator, in orthogonal projection to the principal surface, and the reinforcing member is in contact with the protective layer and the wiring board, and is not in contact with the peripheral region.

10. A radiation detector comprising a flexible base member having a principal surface including a pixel region in which a plurality of pixels are arranged, a scintillator arranged so as to cover the pixel region, a protective layer arranged so as to cover the scintillator, and a wiring board connected to an outer edge portion of the principal surface, wherein the principal surface includes a peripheral region not covered with the protective layer, a reinforcing member in contact with the peripheral region is further arranged in a position overlapping the peripheral region, the protective layer, and the wiring board, and not overlapping the scintillator, in orthogonal projection to the principal surface, the reinforcing member is in contact with the protective layer and the wiring board, and is not in contact with the peripheral region, the protective layer includes an upper surface in a position furthest from the principal surface, and the reinforcing member is arranged nearer to a principal surface side than a virtual surface including the upper surface and parallel to the principal surface.

11. A radiation imaging apparatus comprising:

the radiation detector of claim 10; and a signal processor configured to process an output signal from the radiation detector.

12. A radiation imaging system comprising:

the radiation imaging apparatus of claim 11; and a radiation source configured to emit radiation to the radiation imaging apparatus.

* * * * *